(12) United States Patent
Kitada

(10) Patent No.: US 12,022,735 B2
(45) Date of Patent: Jun. 25, 2024

(54) PIEZOELECTRIC ELEMENT, LIQUID EJECTING HEAD, AND LIQUID EJECTING APPARATUS

(71) Applicant: SEIKO EPSON CORPORATION, Tokyo (JP)

(72) Inventor: Kazuya Kitada, Matsumoto (JP)

(73) Assignee: SEIKO EPSON CORPORATION (JP)

( * ) Notice: Subject to any disclaimer, the term of this patent is extended or adjusted under 35 U.S.C. 154(b) by 0 days.

(21) Appl. No.: 17/891,400

(22) Filed: Aug. 19, 2022

(65) Prior Publication Data

US 2023/0057734 A1 Feb. 23, 2023

(30) Foreign Application Priority Data

Aug. 20, 2021 (JP) ................. 2021-134503

(51) Int. Cl.
  *B41J 2/14*  (2006.01)
  *H10N 30/00*  (2023.01)
  *H10N 30/20*  (2023.01)
  *H10N 30/853*  (2023.01)

(52) U.S. Cl.
  CPC .... *H10N 30/10516* (2023.02); *B41J 2/14233* (2013.01); *H10N 30/2047* (2023.02); *H10N 30/8554* (2023.02)

(58) Field of Classification Search
  None
  See application file for complete search history.

(56) References Cited

U.S. PATENT DOCUMENTS

| 2011/0205310 A1* | 8/2011 | Osawa ............... H10N 30/1051 347/68 |
| 2018/0175277 A1* | 6/2018 | Kitada ................ B41J 2/14201 |
| 2019/0288179 A1* | 9/2019 | Morozumi ....... H10N 30/10516 |

FOREIGN PATENT DOCUMENTS

JP 2004-066600 A 3/2004

* cited by examiner

*Primary Examiner* — Erica S Lin
(74) *Attorney, Agent, or Firm* — Harness, Dickey & Pierce, P.L.C.

(57) ABSTRACT

A piezoelectric element in which a first electrode, a piezoelectric layer, and a second electrode are stacked on a substrate is provided. The piezoelectric element is a piezoelectric element in which the first electrode, the piezoelectric layer, and the second electrode are stacked in order on the substrate and includes an orientation control layer that is provided between the piezoelectric layer and the first electrode and that controls orientation of the piezoelectric layer and a titanium layer that is provided between the first electrode and the orientation control layer and that contains at least Ti.

20 Claims, 9 Drawing Sheets

PIEZOELECTRIC ELEMENT, LIQUID EJECTING HEAD, AND LIQUID EJECTING APPARATUS

The present application is based on, and claims priority from JP Application Serial Number 2021-134503, filed Aug. 20, 2021, the disclosure of which is hereby incorporated by reference herein in its entirety.

BACKGROUND

1. Technical Field

The present disclosure relates to a piezoelectric element, a liquid ejecting head, and a liquid ejecting apparatus.

2. Related Art

Typical piezoelectric elements have a structure in which a lower electrode layer, a piezoelectric layer, and an upper electrode layer are stacked in this order on a substrate. For example, it is known that, in an instance in which the piezoelectric layer is formed of lead zirconate titanate (hereinafter, referred to as PZT) with a rhombohedral structure, when the PZT layer is oriented in a (100) plane, piezoelectric characteristics are improved. Accordingly, a method of orienting the PZT layer in the (100) plane has been proposed (for example, JP-A-2004-66600). JP-A-2004-66600 discloses a structure in which an orientation control layer formed of lanthanum nickel oxide is included under the PZT layer.

However, for example, in an instance in which the substrate is strongly oriented, even when the piezoelectric layer is formed on the orientation control layer, the piezoelectric layer may be insufficiently oriented.

SUMMARY

The disclosure is able to be realized as the following aspects. According to an aspect of the disclosure, a piezoelectric element is provided. The piezoelectric element is a piezoelectric element in which a first electrode, a piezoelectric layer, and a second electrode are stacked in order on a substrate and includes an orientation control layer that is provided between the piezoelectric layer and the first electrode and that controls orientation of the piezoelectric layer and a titanium layer that is provided between the first electrode and the orientation control layer and that contains at least Ti.

Moreover, according to an aspect of the disclosure, a liquid ejecting head is provided. The liquid ejecting head includes the piezoelectric element and a diaphragm that vibrates when the piezoelectric element is driven.

Moreover, according to an aspect of the disclosure, a liquid ejecting apparatus is provided. The liquid ejecting apparatus includes the liquid ejecting head and a control section that controls operation of the liquid ejecting head.

DESCRIPTION OF EXEMPLARY EMBODIMENTS

Figure 1:
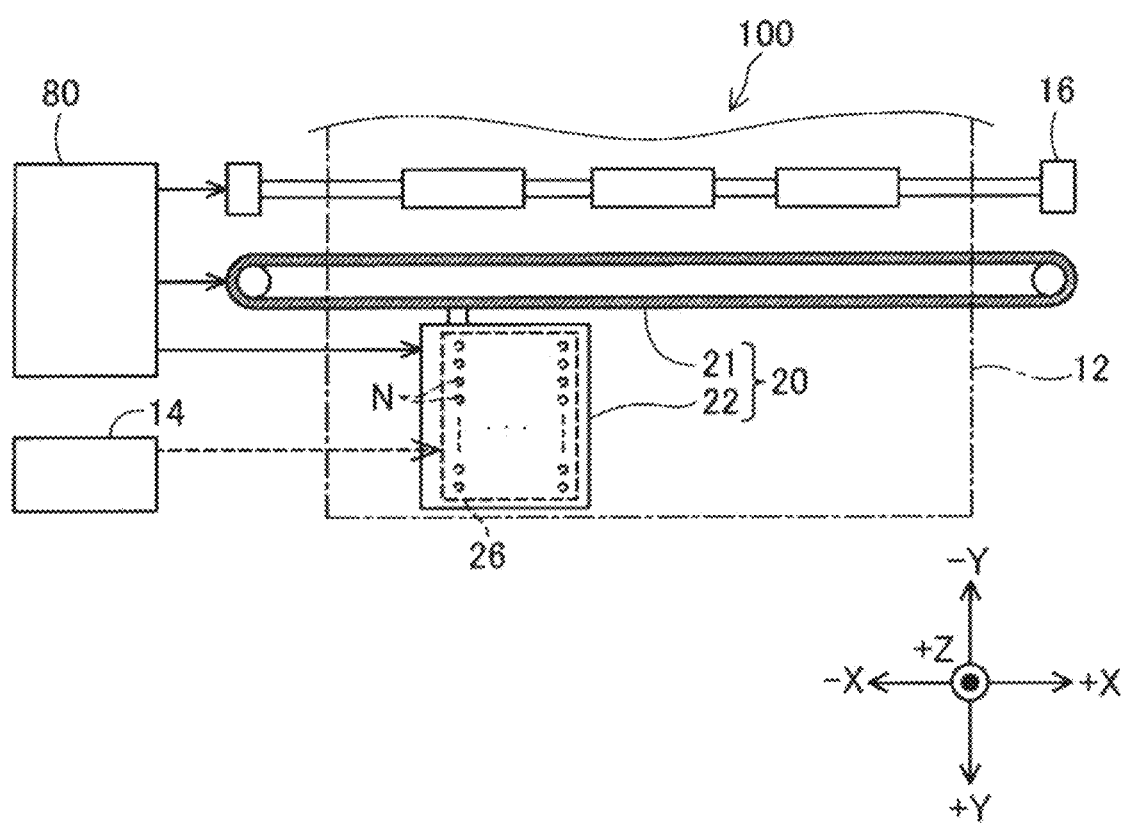
FIG. 1 is a schematic view illustrating an outline configuration of a liquid ejecting apparatus.

A. Embodiment:

A1. Overall Configuration of Liquid Ejecting Apparatus:

FIG. 1 is a schematic view illustrating an outline configuration of a liquid ejecting apparatus 100 in an embodiment. The liquid ejecting apparatus 100 is an ink jet printing apparatus that performs printing by ejecting liquid droplets of ink, which is a liquid, onto a medium 12. As the medium 12, in addition to a printing sheet, any printing target made from a resin film, fabric, or the like is adoptable. In the following description, the X direction, the Y direction, and the Z direction that are orthogonal to each other are used. When an orientation is specified, a plus or minus sign is combined with notation of a direction in such a manner that a positive direction is represented by "+" and a negative direction is represented by "−". In the present embodiment, the X direction is a main scanning direction that is a moving direction of a liquid ejecting head 26. The Y direction is a sub-scanning direction that is a medium-feeding direction orthogonal to the main scanning direction. The −Z direction is an ink ejection direction.

The liquid ejecting apparatus 100 includes the liquid ejecting head 26, a head moving mechanism 20, a liquid storage section 14, a transport mechanism 16, and a control section 80.

The liquid storage section 14 stores ink to be supplied to the liquid ejecting head 26. As the liquid storage section 14, a bag-shaped liquid pack formed of a flexible film, an ink tank capable of being refilled with ink, an attachable/detachable ink cartridge, and the like are able to be used.

The liquid ejecting head 26 has a plurality of nozzles N for ejecting the ink. The plurality of nozzles N are aligned in the Y direction. The liquid ejecting head 26 ejects the ink, which is supplied from the liquid storage section 14, from the plurality of nozzles N toward the medium 12.

The head moving mechanism 20 includes a transport belt 21 and a carriage 22 that accommodates the liquid ejecting head 26. The carriage 22 is coupled to the transport belt 21 and is reciprocated in the X direction in accordance with the transport belt 21 being driven. The transport mechanism 16 transports the medium 12 in the +Y direction.

The control section 80 includes one or more processing circuits such as a central processing unit (CPU) or a field programmable gate array (FPGA) and one or more storage circuits such as semiconductor memory and controls overall operation of the liquid ejecting apparatus 100. The control section 80 is electrically coupled to the transport mechanism 16, the head moving mechanism 20, and the liquid ejecting head 26 and controls each section. The liquid is ejected from the nozzles N onto the medium 12 transported by the transport mechanism 16, and an image is thereby printed on the medium 12.

Figure 2:
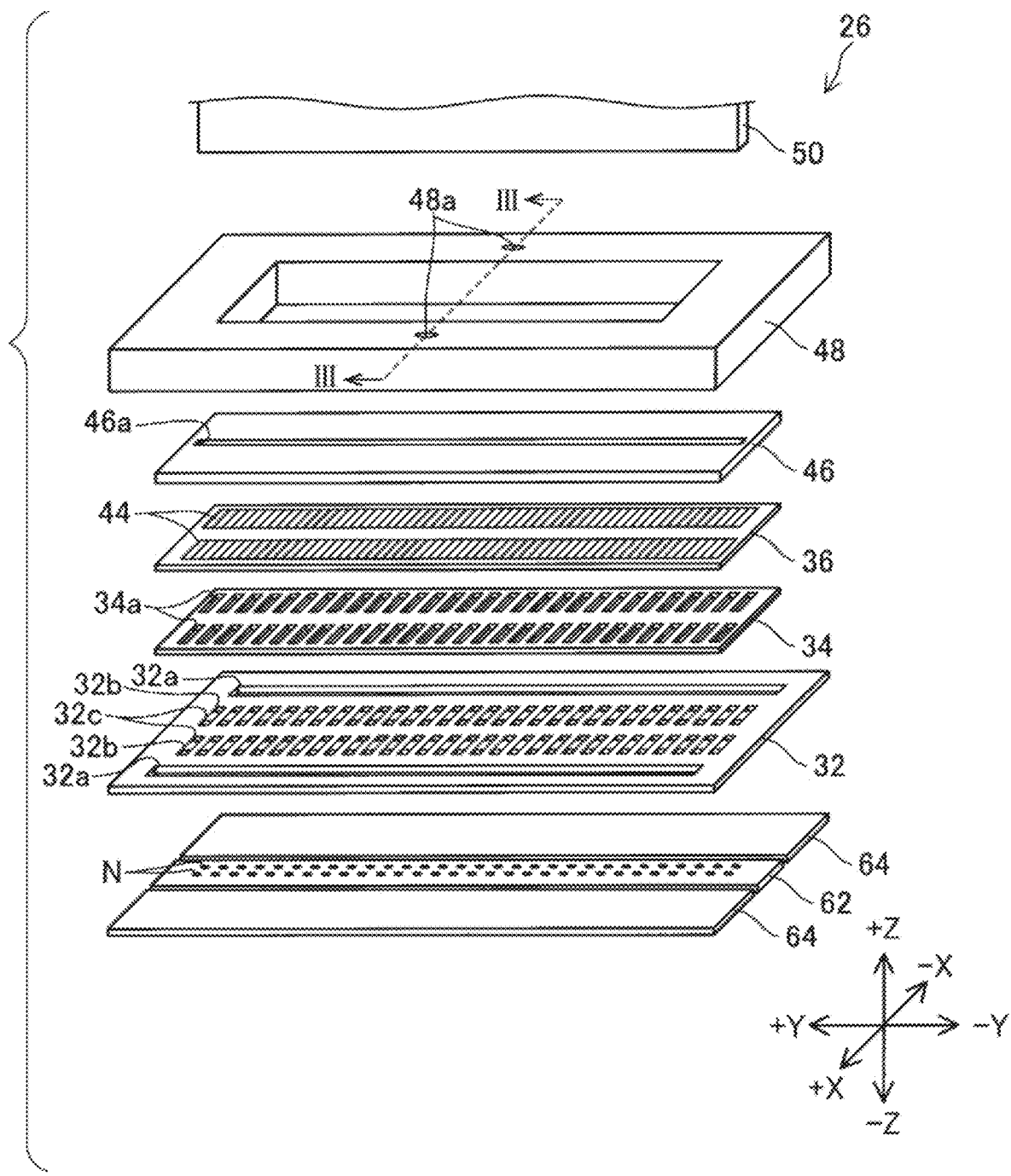
FIG. 2 is an exploded perspective view of a liquid ejecting head.
Figure 3:
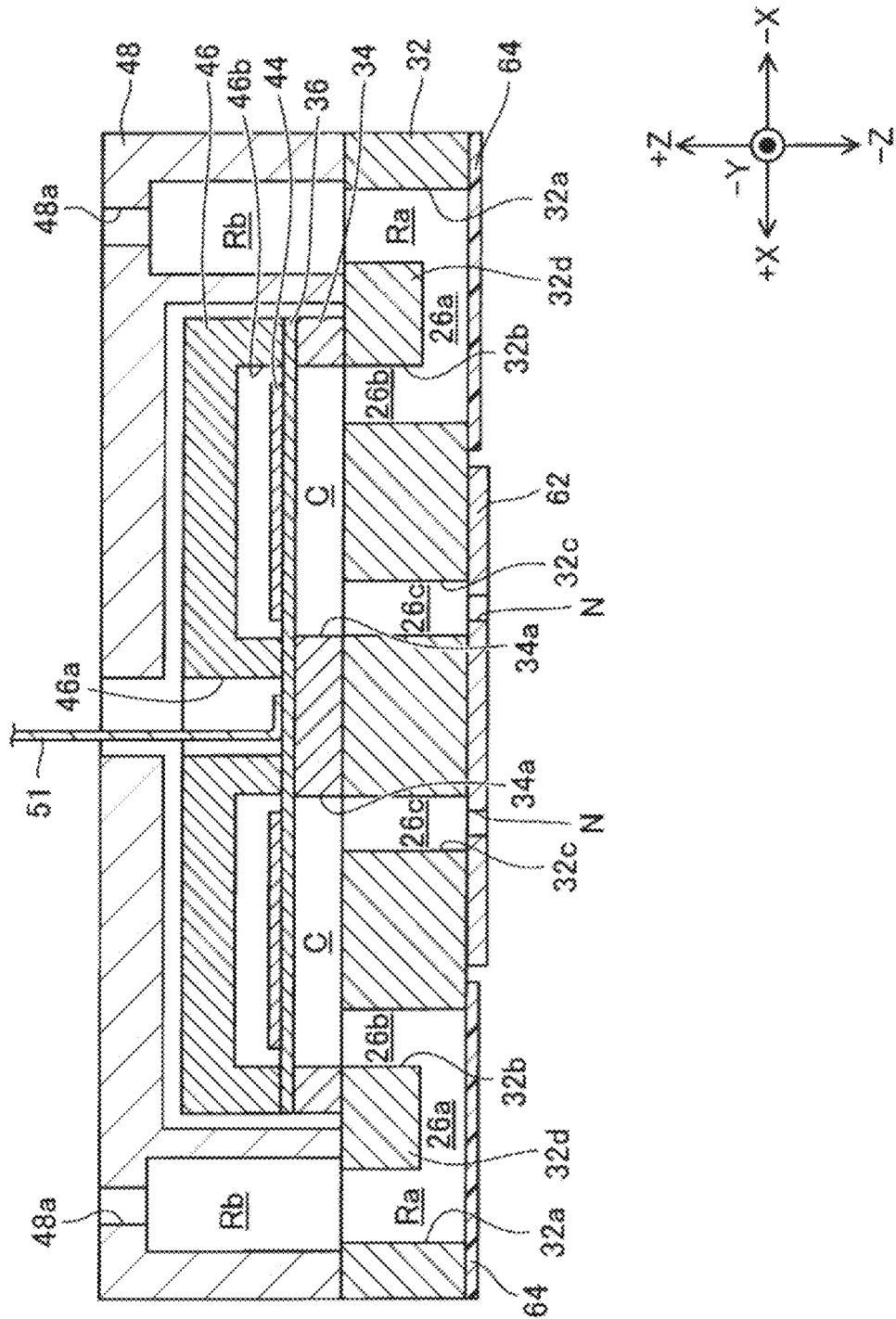
FIG. 3 is a sectional view along line III-III in FIG. 2.
Figure 4:
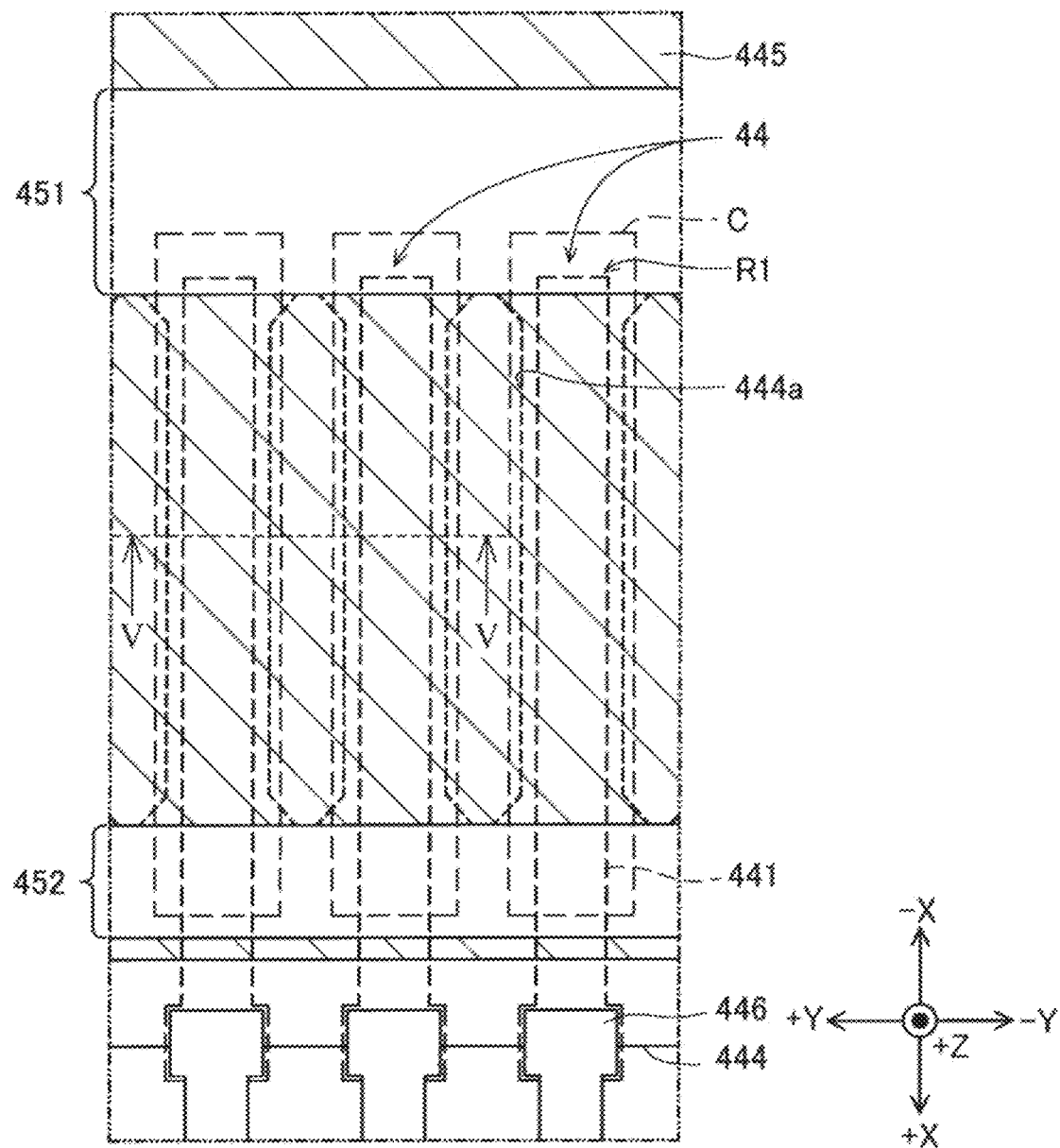
FIG. 4 is a plan view of a piezoelectric element.
Figure 5:
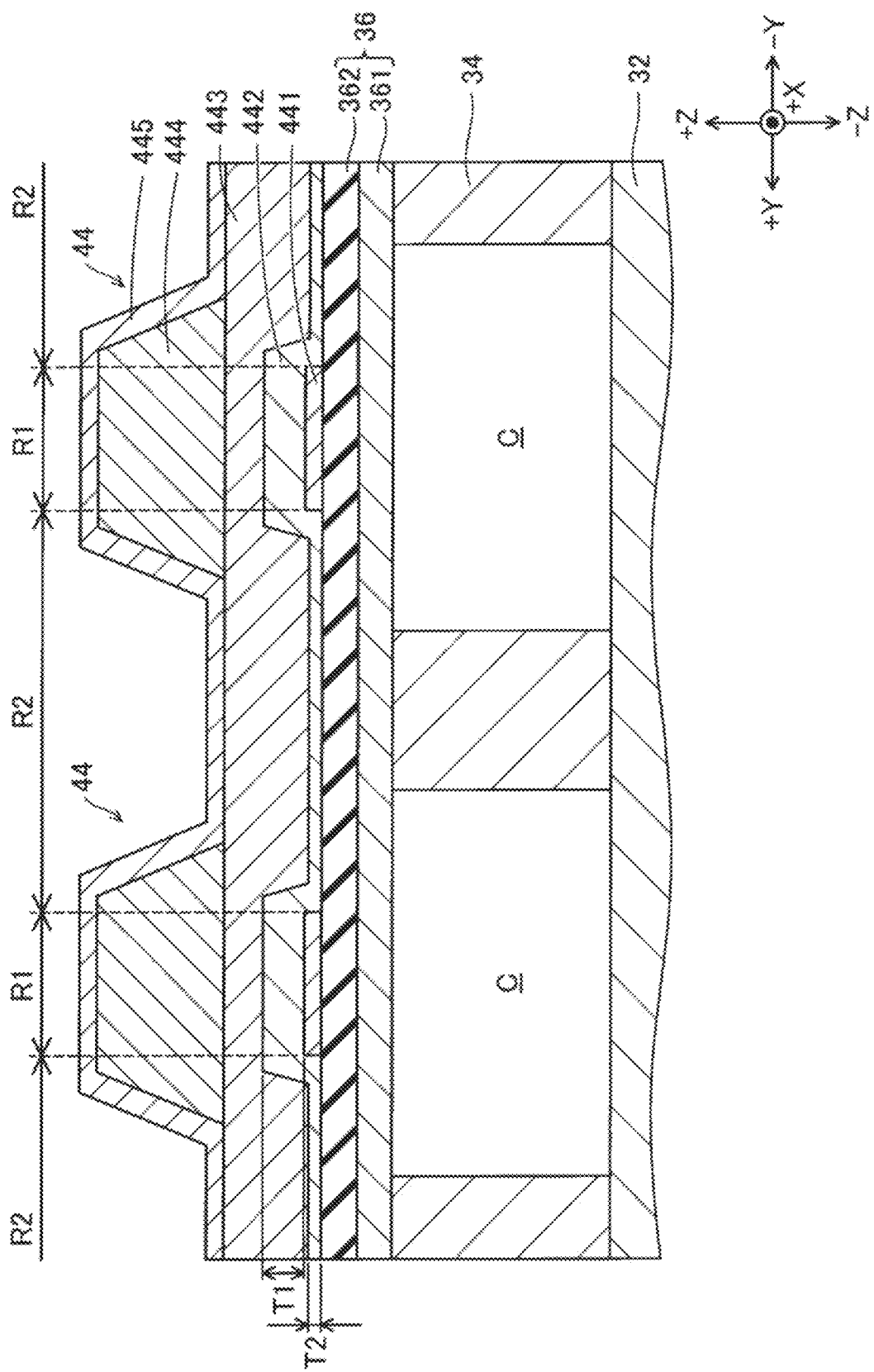
FIG. 5 is a sectional view along line V-V in FIG. 4.

A2. Configuration of Liquid Ejecting Head:

FIG. 2 is an exploded perspective view of the liquid ejecting head 26 according to the embodiment. FIG. 3 is a sectional view along line III-III in FIG. 2. FIG. 4 is a plan view of a piezoelectric element 44. In FIG. 4, a formation region of a second electrode 445 other than a region in which a first conductive layer 451 is formed and a region in which a second conductive layer 452 is formed is hatched. FIG. 5 is a sectional view along line V-V in FIG. 4.

As illustrated in FIG. 2, the liquid ejecting head 26 has a nozzle plate 62, two vibration absorbers 64, a flow path substrate 32, a pressure chamber substrate 34, a diaphragm 36, a sealing body 46, a housing section 48, and a circuit substrate 50. The nozzle plate 62, the vibration absorbers 64, the flow path substrate 32, the pressure chamber substrate 34, the diaphragm 36, and the sealing body 46 are plate-shaped members elongated in the Y direction. Each of the nozzle plate 62, the flow path substrate 32, the pressure chamber substrate 34, the diaphragm 36, and the sealing body 46 has a structure which is substantially linearly symmetrical with respect to a center line in the X direction. The sizes in plan view of the pressure chamber substrate 34, the diaphragm 36, and the sealing body 46 are smaller than the sizes in plan view of the flow path substrate 32 and the housing section 48. When assembled, the nozzle plate 62 and the two vibration absorbers 64, the flow path substrate 32, the pressure chamber substrate 34, the diaphragm 36, the sealing body 46, and the housing section 48 are stacked in this order and bonded to each other by using, for example, an adhesive.

The nozzle plate 62 is a plate-shaped member in which the plurality of nozzles N are formed. The nozzles N are through holes each having a substantially circular shape in plan view. The plurality of nozzles N are aligned in the Y direction. The plurality of nozzles N are aligned in two arrays in the X direction. The two vibration absorbers 64 are flexible films and are arranged with the nozzle plate 62 interposed therebetween in the X direction.

The flow path substrate 32 includes two first openings 32a, a plurality of second openings 32b, and a plurality of third openings 32c. The shape in plan view of each of the first openings 32a is a rectangle elongated in the Y direction. The first openings 32a are formed along sides of the flow path substrate 32 which are parallel to the Y direction. The plurality of second openings 32b are aligned in the Y direction. Similarly, the plurality of third openings 32c are aligned in the Y direction. The second openings 32b are aligned in two arrays, and the third openings 32c are aligned in two arrays. One of the first openings 32a, one array of the second openings 32b, one array of the third openings 32c, one array of the third openings 32c, one array of the second openings 32b, and the other of the first openings 32a are formed so as to be aligned in this order in the X direction. Moreover, the second openings 32b and the third openings 32c adjacent in the X direction are formed such that the positions thereof in the Y direction are substantially the same.

A plurality of openings 34a are formed in the pressure chamber substrate 34. The shape in plan view of each of the openings 34a is a rectangle elongated in the X direction. The plurality of openings 34a are aligned in the Y direction. The plurality of openings 34a are aligned in two arrays in the X direction. Note that each of the openings 34a is formed so as to overlap a corresponding one of the second openings 32b and a corresponding one of the third openings 32c, which are formed in the flow path substrate 32 in an adjacent manner, when viewed in the Z direction.

Piezoelectric elements 44 are formed on the diaphragm 36 at positions at which, when viewed in the Z direction, the piezoelectric elements 44 overlap the openings 34a formed in the pressure chamber substrate 34. The sealing body 46 reinforces the strength of the pressure chamber substrate 34 and the diaphragm 36 and protects the piezoelectric elements 44. The sealing body 46 includes a sealing body opening 46a and a sealing body recessed portion 46b illustrated in FIG. 3. The shape in plan view of the sealing body opening 46a is a rectangle elongated in the Y direction. As illustrated in FIG. 3, the sealing body recessed portion 46b is formed to be recessed from a surface of the sealing body 46 which faces the piezoelectric elements 44.

A drive circuit (not illustrated) for driving the piezoelectric element 44 is mounted on the circuit substrate 50. The drive circuit is realized by an integrated circuit (IC) chip that outputs a drive signal and a reference voltage for driving the piezoelectric element 44. The drive circuit and the piezoelectric element 44 are electrically coupled via an electric wire 51 illustrated in FIG. 3.

The housing section 48 is an enclosure for storing the ink and has a frame shape. When stacked, the pressure chamber substrate 34, the diaphragm 36, and the sealing body 46 are arranged in an interior space of the housing section 48. A through hole 48a is formed in each end of the housing section 48 in the X direction.

As illustrated in FIG. 3, a space Rb extending in the Y direction is formed in each end of the housing section 48 in the X direction. The space Rb communicates with the through hole 48a. A space Ra, a supply liquid chamber 26a, and a supply flow path 26b are formed by the flow path substrate 32 and the vibration absorber 64 being coupled to each other. The space Ra is an interior space of the first opening 32a. The supply liquid chamber 26a is a space demarcated by a partition wall 32d, which partitions the first opening 32a and the second opening 32b, and the vibration absorber 64. The supply flow path 26b is an interior space of the second opening 32b. The space Ra communicates with the space Rb and the supply liquid chamber 26a, and the supply liquid chamber 26a communicates with the supply flow path 26b. A pressure chamber C is formed by the pressure chamber substrate 34 and the diaphragm 36 being coupled to each other. The pressure chamber C is a space demarcated by the opening 34a and the diaphragm 36. The pressure chamber C communicates with the supply flow path 26b. A communication flow path 26c is formed by the flow path substrate 32 and the nozzle plate 62 being coupled to each other. The communication flow path 26c is an interior space of the third opening 32c. The communication flow path 26c communicates with the pressure chamber C and a nozzle N.

The space Ra and the space Rb function as liquid storage chambers for storing the ink to be supplied to the pressure chamber C. The space Rb communicates with a plurality of spaces Ra aligned in the Y direction, and the ink supplied via the through hole 48a is stored in the plurality of spaces Ra via the space Rb. The ink stored in the space Ra flows through the supply liquid chamber 26a and the supply flow path 26b and is then supplied to the pressure chamber C.

The piezoelectric elements 44 are each arranged at a position at which the piezoelectric element 44 overlaps a corresponding one of two pressure chambers C in plan view in the Z direction. A drive signal and a reference voltage are input from the circuit substrate 50 to the piezoelectric element 44 via the electric wire 51. When the drive signal and the reference voltage are input and a voltage is applied, the piezoelectric element 44 deforms, the diaphragm 36 vibrates in conjunction with the deformation of the piezoelectric element 44, the pressure inside the pressure chamber C changes, and the ink is thus ejected from the nozzle N.

A3. Configuration of Piezoelectric Element:

As illustrated in FIG. 5, the piezoelectric element 44 is formed such that a first electrode 441, a titanium layer 442, an orientation control layer 443, a piezoelectric layer 444, and the second electrode 445 are stacked in this order on the diaphragm 36. Here, a portion in which the first electrode 441, the titanium layer 442, the orientation control layer 443, the piezoelectric layer 444, and the second electrode 445 overlap each other when viewed in the Z direction is referred to as a first region R1. The first region R1 is a portion in which the piezoelectric layer 444 deforms when a voltage is applied between the first electrode 441 and the second electrode 445.

The diaphragm 36 serving as a substrate includes a silicon substrate 361 and an insulator layer 362. Silicon dioxide is formed on a surface of the silicon substrate 361 which is located on the +Z direction side and which is in contact with the insulator layer 362. The insulator layer 362 is formed of zirconium oxide ($ZrO_2$). Note that the insulator layer 362 may be formed of silicon nitride (SiN) or the like. In the present embodiment, the insulator layer 362 is a non-oriented layer. Another layer of metal oxide or the like may be interposed between the silicon substrate 361 and the insulator layer 362.

The first electrode 441 is formed by a titanium (Ti) layer, a platinum (Pt) layer, and an iridium (Ir) layer. Note that the first electrode 441 is not limited to being formed by the plurality of layers of the Ti layer, the Pt layer, and the Ir layer and may be formed by a single layer made of a metal material, such as Ti, Pt, Ir, aluminum (Al), nickel (Ni), gold (Au), or copper (Cu), or may be formed by a plurality of layers made of some of these metal materials.

The titanium layer 442 is a canceling layer that has a function of canceling an influence of orientation which is applied from a base to the piezoelectric layer 444. In the present embodiment, the base corresponds to the first electrode 441. The first electrode 441 is a metal layer containing Pt in the present embodiment and is thus likely to be (111) oriented. As a result, when the orientation control layer 443 is formed on the first electrode 441 without the titanium layer 442 being provided, the orientation control layer 443 may be insufficiently (100) oriented due to the influence of the (111) oriented first electrode 441. Accordingly, in the present embodiment, by forming the titanium layer 442 between the first electrode 441 and the orientation control layer 443, it is possible to cancel the influence of orientation which is applied from the first electrode 441 and to sufficiently (100) orient the orientation control layer 443. Moreover, it is possible to suitably (100) orient the piezoelectric layer 444 formed on the orientation control layer 443, thus making it possible to improve piezoelectric characteristics of the piezoelectric element 44. The titanium layer 442 is a layer mainly containing Ti. When an amount of substance [mol] of a metallic element which is contained in the titanium layer 442 and differs from Ti is na and when an amount of substance [mol] of Ti contained in the titanium layer 442 is nt, nt satisfies formula (1) below.

$$na < nt \quad \text{formula (1)}$$

It is desirable that nt satisfy formula (2) below, and it is more desirable that nt satisfy formula (3) below. This makes it possible to further improve the function of canceling the above-described influence of orientation.

$$na \leq 0.4 \times nt \quad \text{formula (2)}$$

$$na \leq 0.2 \times nt \quad \text{formula (3)}$$

It is desirable that the thickness of the titanium layer be not less than 1 nm and not more than 30 nm. This makes it possible to suitably exert the function of canceling the above-described influence of orientation. Moreover, the titanium layer 442 is desirably amorphous.

A content ratio of Ti of the titanium layer 442 which is measured by energy dispersive X-ray spectroscopy (EDX) analysis is higher than a content ratio of Ti of the orientation control layer 443 which is measured by EDX analysis. Here, a content ratio corresponds to an atomic percentage [atom %]. In the present embodiment, the orientation control layer 443 contains iron (Fe). A content ratio of Fe of the titanium layer 442 which is measured by EDX analysis is lower than a content ratio of Fe of the orientation control layer 443 which is measured by EDX analysis. Moreover, the content ratio of Fe of the titanium layer 442 which is measured by EDX analysis is higher than a content ratio of Fe of the first electrode 441 which is measured by EDX analysis. When the titanium layer 442 contains Fe, it is possible to improve adhesion of the orientation control layer 443 compared with an instance in which the titanium layer 442 does not contain Fe. In the present embodiment, EDX analysis is performed by using a JEM-ARM200F manufactured by JEOL Ltd. Note that, as another embodiment, the titanium layer 442 does not necessarily contain Fe.

The orientation control layer 443 has a function of controlling orientation of the piezoelectric layer 444. The orientation control layer 443 contains at least one of lead (Pb) and bismuth (Bi) as a constituent element. In the present embodiment, the orientation control layer 443 contains lead (Pb), bismuth (Bi), iron (Fe), and titanium (Ti). Specifically, the orientation control layer 443 is a composite oxide represented by $((Pb,Bi)(Fe,Ti)O_x)$. Moreover, the orientation control layer 443 has a perovskite structure. It is desirable that the thickness of the orientation control layer 443 be not less than 5 nm and not more than 200 nm. When the orientation control layer 443 has the aforementioned thickness, it is possible to enhance displacement efficiency indicated by a displacement amount of the piezoelectric layer 444 with respect to an applied voltage while retaining the function of controlling orientation.

As another embodiment, the orientation control layer 443 may contain Pb, Fe, and Ti and no Bi or may contain Bi, Fe, and Ti and no Pb. Moreover, the orientation control layer 443 does not necessarily have the perovskite structure.

The piezoelectric layer 444 is formed of a composite oxide that contains Pb, Zr, and Ti as constituent elements. In the present embodiment, the piezoelectric layer 444 has a rhombohedral system and is formed of lead zirconate titanate (PZT) having a perovskite structure. Note that the piezoelectric layer 444 is not limited to being formed of PZT, and, for example, potassium sodium niobate $(K,Na)NbO_3)$, lead lanthanum zirconate titanate $((Pb,La)(Zr,Ti)O_3)$, lead niobate zirconium titanate $(Pb(Zr,Ti,Nb)O_3)$, lead magnesium niobate zirconium titanate $(Pb(Zr,Ti)(Mg,Nb)O_3)$, lead magnesium niobate-lead titanate solid solution $(Pb(Mg,Nb)O_3-PbTiO_3)$, bismuth sodium titanate $((Bi,Na)TiO_3)$, or the like is usable. A crystal structure of the piezoelectric layer 444 is not limited to the perovskite structure and may be any crystal structure which has piezoelectric characteristics.

The second electrode 445 is formed of Ir. Note that the second electrode 445 is not limited to being formed of Ir and may be formed by a single layer made of a metal material, such as Pt, Al, Ni, Au, or Cu, or may be formed by a plurality of layers made of some of these metal materials.

As illustrated in FIG. 4, the first electrode 441 is formed for each pressure chamber C, that is, each first region R1. The first electrode 441 is drawn out in the +X direction and individually electrically coupled to the drive circuit via a first wire 446 in electrical contact with the first electrode 441. The first wire 446 is formed of a conductive material having resistance lower than that of the first electrode 441. Specifically, the first wire 446 includes, for example, a conductive film of gold (Au) formed on a surface of a conductive film formed of nichrome (NiCr). On the other hand, the second electrode 445 is formed so as to cover a plurality of first regions R1 aligned in the Y direction. That is, each first electrode 441 is provided individually in a corresponding one of the plurality of first regions R1, whereas the second electrode 445 is provided in common to the plurality of first regions R1. An individual drive voltage is applied to the first electrode 441 for each first region R1, and a reference voltage common to the plurality of first regions R1 aligned in the Y direction is applied to the second electrode 445. The piezoelectric layer 444 is formed to have a through hole 444a in each portion between adjacent first regions R1. The through hole 444a is a region in which no piezoelectric layer 444 is formed.

As illustrated in FIG. 5, a region in which the piezoelectric layer 444 is interposed between the first electrode 441 and the second electrode 445 is the first region R1. In contrast, a region in which the piezoelectric layer 444 is not interposed between the first electrode 441 and the second electrode is a second region R2. A thickness T1 of the titanium layer 442 in the first region R1 is larger than a thickness T2 of the titanium layer 442 in the second region R2. Since the piezoelectric layer 444 in the second region R2 has only a slight influence on ejection performance, the titanium layer 442 in the second region R2 is not required to have higher piezoelectric performance than that of the titanium layer 442 in the first region R1. Accordingly, the thickness T2 is able to be smaller than the thickness T1. Moreover, when the titanium layer 442 is also formed in the second region R2, it is possible to suppress the piezoelectric layer 444 from cracking at a boundary between the first region R1 and the second region R2 compared with an instance in which no titanium layer 442 is formed in the second region R2. This is because, although a difference in orientation of the piezoelectric layer 444 may be generated at a boundary between the first region R1 and the second region R2 in the instance in which no titanium layer 442 is formed in the second region R2, when the titanium layer 442 is formed in the second region R2, it is difficult for a difference in orientation to be generated.

As illustrated in FIG. 4, the first conductive layer 451 and the second conductive layer 452 each having a strip-like shape extending in the Y direction are formed on the second electrode 445. The first conductive layer 451 and the second conductive layer 452 are electrically coupled to the second electrode 445. The first conductive layer 451 and the second conductive layer 452 are arranged so as to face each other in the X direction with the piezoelectric element 44 interposed therebetween. The first conductive layer 451 and the second conductive layer 452 are conductive patterns having a structure in which, for example, a gold conductive film is formed on a surface of a conductive film formed of nichrome. The first conductive layer 451 and the second conductive layer 452 also function as weights for suppressing vibrations of the diaphragm 36.

A4. Method of Producing Piezoelectric Element:

First, the diaphragm 36 is produced. Specifically, by thermally oxidizing the silicon substrate 361, silicon dioxide is formed on the +Z-direction surface. Next, a Zr layer is formed by a sputtering method, Zr is thermally oxidized, and a $ZrO_2$ layer corresponding to the insulator layer 362 is thereby formed.

Next, the first electrode 441 is formed. Specifically, the Ti layer and the Pt layer are formed in order by the sputtering method. The Ir layer is then formed by the sputtering method. Next, the Ti layer, the Pt layer, and the Ir layer are patterned by using photolithography. Specifically, a resist is applied to the Ir layer, and Ti, Pt, and Ir are ion-milled after exposure. The resist is thereafter removed by oxygen plasma asking, and the substrate is washed.

Next, the titanium layer 442 is formed by using, for example, the sputtering method. The titanium layer 442 may be formed by a chemical vapor deposition (CVD) method or a metal organic decomposition (MOD) method. Next, the orientation control layer 443 is formed by the MOD method. Specifically, a propionic acid solution of Pb, Bi, Fe, and Ti adjusted to have a molar ratio of Bi:Pb:Fe:Ti=110:10:50:50 is applied to the diaphragm 36 by a spin coating method first. Next, a hot plate is used to perform drying and degreasing at 350°. Heating treatment is then performed at 700° C. for five minutes by rapid thermal anneal (RTA).

Next, the piezoelectric layer 444 is formed by a solution method. As a specific forming method, an acetic acid solution of Pb, Zr, and Ti adjusted to have a molar ratio of Pb:Zr:Ti=118:52:48 is applied to the orientation control layer 443 by the spin coating method first. Next, a hot plate is used to perform drying and degreasing at 200° C. and 410° C. Heating treatment is then performed at 740° C. for five minutes by rapid thermal anneal (RTA).

Next, the second electrode 445 is formed. Specifically, Ir is formed by the sputtering method. Photolithography is then used to pattern the Ir layer.

According to the aforementioned aspect, by including the titanium layer 442, the piezoelectric element 44 is able to cancel the influence of orientation which is applied from the first electrode 441 and sufficiently (100) orient the orientation control layer 443. Accordingly, it is possible to suitably (100) orient the piezoelectric layer 444 to be formed on the orientation control layer 443. It is thus possible to improve piezoelectric characteristics of the piezoelectric element 44.

B. Other Embodiments (B1) In the aforementioned embodiment, the first electrode 441 is formed in each of the first regions R1, and the second electrode 445 is provided in common to the plurality of first regions R1 aligned in the Y direction. In contrast, the first electrode 441 may be provided in common to the plurality of first regions R1 aligned in the Y direction, and the second electrode 445 may be provided in each of the first regions R1.

(B2) The method of producing the piezoelectric element 44 is not limited to the above-described method. For example, etching performed to pattern the first electrode 441 may be performed by an etching method other than ion milling. Moreover, the method of forming the orientation control layer 443 is not limited to the MOD method and may be another method, such as a sol-gel method or the sputtering method.

(B3) In the aforementioned embodiment, the first electrode 441 includes, in order, the Ti layer, the Pt layer, and the Ir layer. Moreover, the three layers of the Ti layer, the Pt layer, and the Ir layer are drawn out in the +X direction to be electrically coupled to the drive circuit. In contrast, the configuration may be such that only the Ir layer of the three layers is drawn out in the +X direction to enable the first electrode 441 and the circuit substrate 50 to be electrically coupled to each other.

C. Examples and Comparative Example

C1. Preparation for Examples and Comparative Example:

Example 1, Example 2, and a comparative example described below are prepared.

In Example 1, a piezoelectric element in which the titanium layer and the orientation control layer were stacked in order on the first electrode and lead zirconate titanate was formed as the piezoelectric layer on the orientation control layer was used.

In Example 2, a piezoelectric element in which the titanium layer and the orientation control layer were stacked in order on the first electrode and potassium sodium niobate was formed as the piezoelectric layer on the orientation control layer was used.

In the comparative example, a piezoelectric element in which no titanium layer was included, the orientation control layer was stacked on the first electrode, and lead zirconate titanate was formed as the piezoelectric layer on the orientation control layer was used.

C2. Evaluation of Titanium Layer and Orientation Control Layer:

A portion cut out from the piezoelectric element of Example 1 described above was used as a sample, a section of the sample was exposed by using a focused ion beam (FIB), and a scanning transmission electron microscope-energy-dispersive-spectroscopy (STEM-EDS) line profile in a sectional depth direction was observed. A JEM-ARM200F manufactured by JEOL Ltd. was used as a spherical aberration corrected scanning transmission analytical electron microscope.

Figure 6:
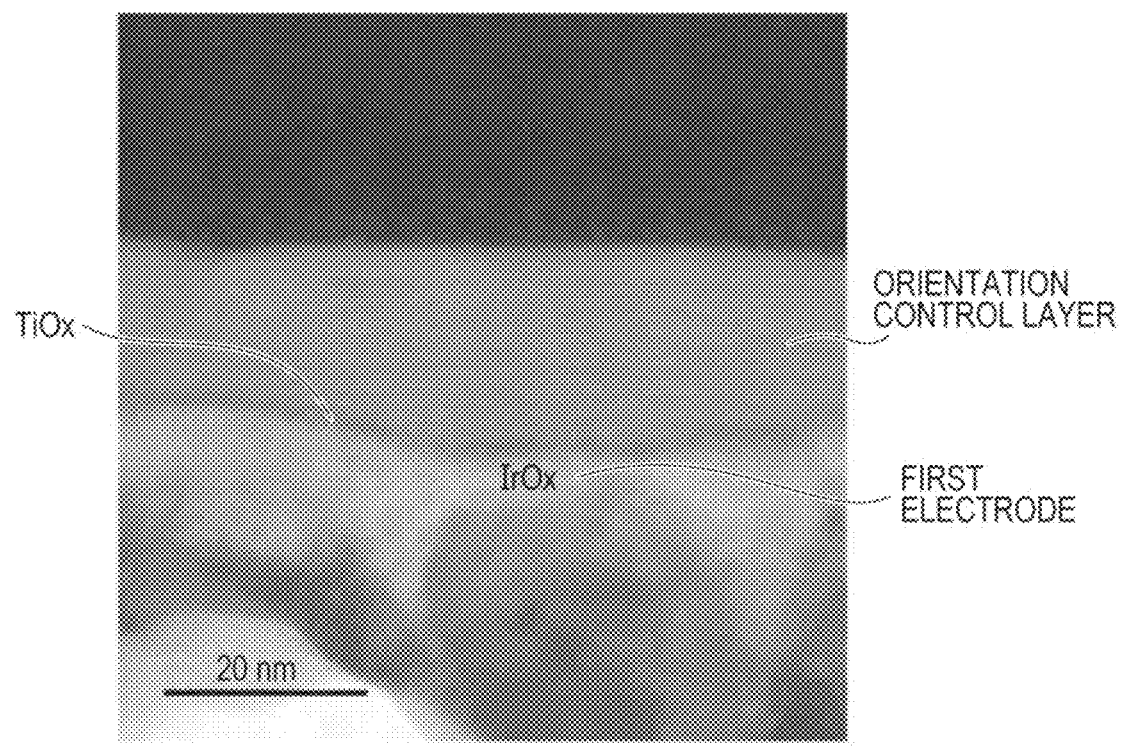
FIG. 6 is a STEM image of a sample.
Figure 7:
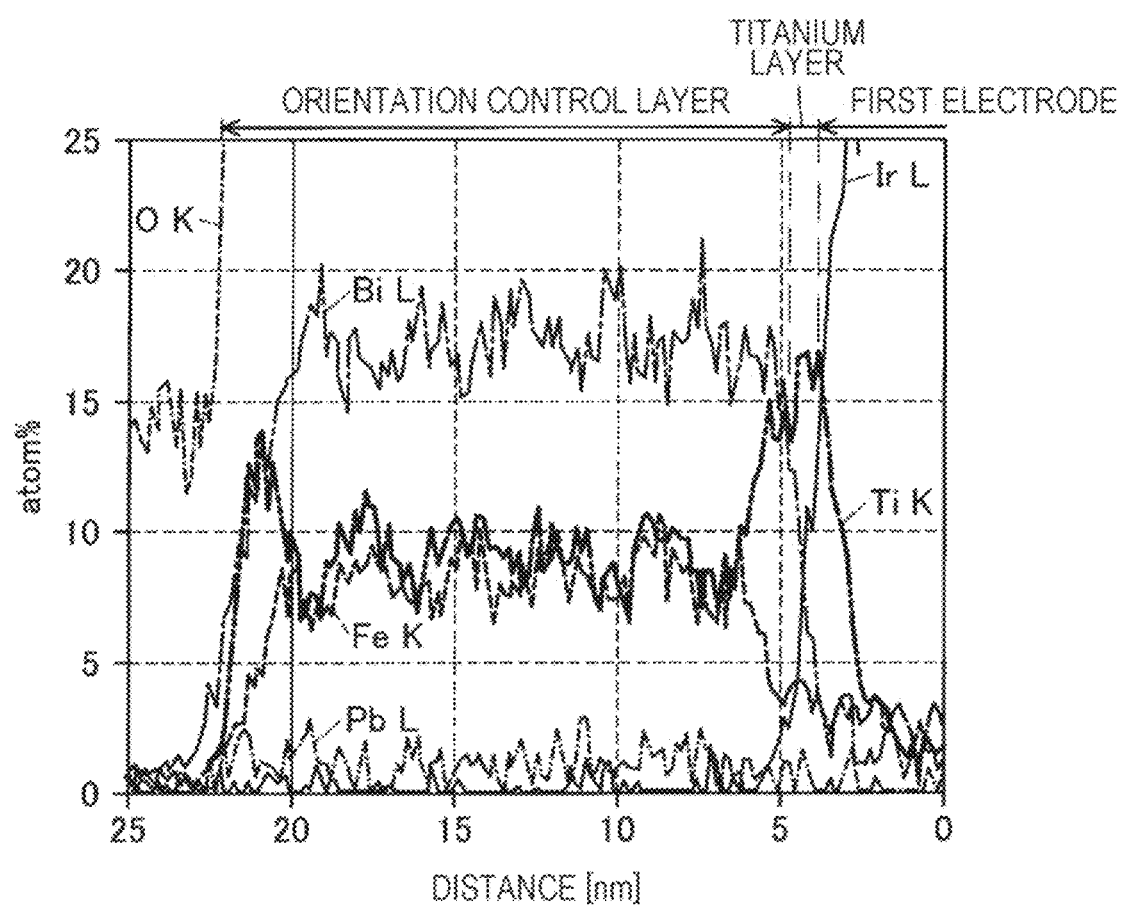
FIG. 7 is a view illustrating a result of EDX of the sample.

FIG. 6 is a STEM image of the sample. FIG. 7 is a view illustrating a result of EDX of the sample. As illustrated in FIG. 6, the titanium layer having a different contrast is able to be observed between the orientation control layer and the first electrode. FIG. 7 shows that the titanium layer between the orientation control layer and the first electrode contains a large amount of Ti. It is considered that the titanium layer is formed of amorphous titanium oxide (TiOx).

C3. Evaluation of Piezoelectric Layer:

X-ray diffraction patterns of Example 1, Example 2, and the comparative example were measured, and degrees of orientation of the piezoelectric layer were evaluated. The X-ray diffraction apparatus was a D8 DISCOVER with GADDS manufactured by Bruker. Measurement conditions were such that a tube voltage was set to 50 kV, a tube current was set to 100 mA, a detector distance was set to 15 cm, a collimator diameter was set to 0.1 mm, and a measurement time was set to 180 seconds. Two-dimensional data obtained through the measurement was converted into X-ray diffraction intensity curves with a 2θ range of 20° to 50°, a χ range of −95° to −85°, a step width of 0.02°, and an intensity normalization method of Bin normalized. Moreover, organization analysis in the depth direction was performed for a sample of Example 1 before formation of the piezoelectric layer and a sample of the comparative example before formation of the piezoelectric layer by using X-ray photoelectron spectroscopy (XPS) while performing reverse sputtering. An ESCALAB 250 manufactured by Thermo Fisher Scientific Inc. was used as an X-ray photoelectron spectroscopy apparatus.

Figure 8:
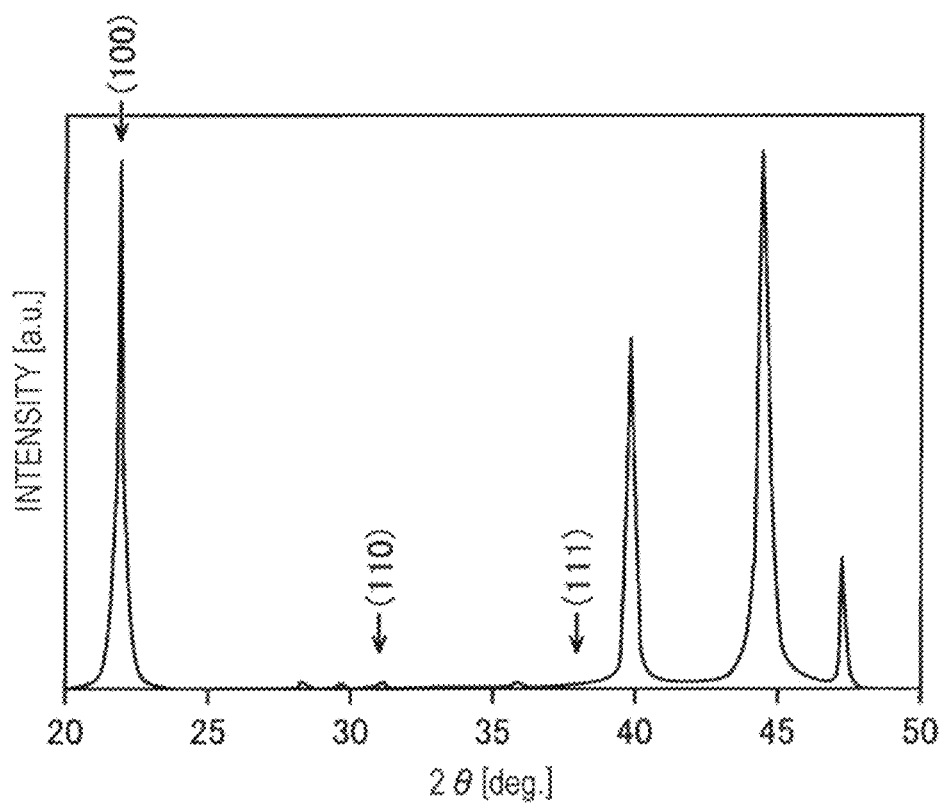
FIG. 8 illustrates an X-ray diffraction pattern of Example 1.
Figure 9:
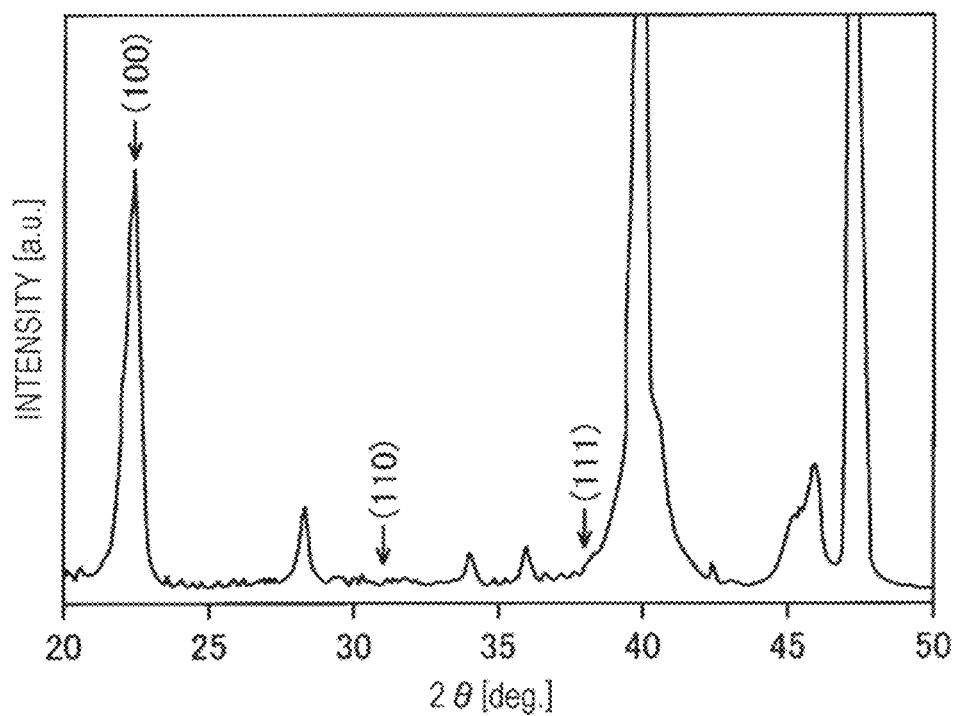
FIG. 9 illustrates an X-ray diffraction pattern of Example 2.
Figure 10:
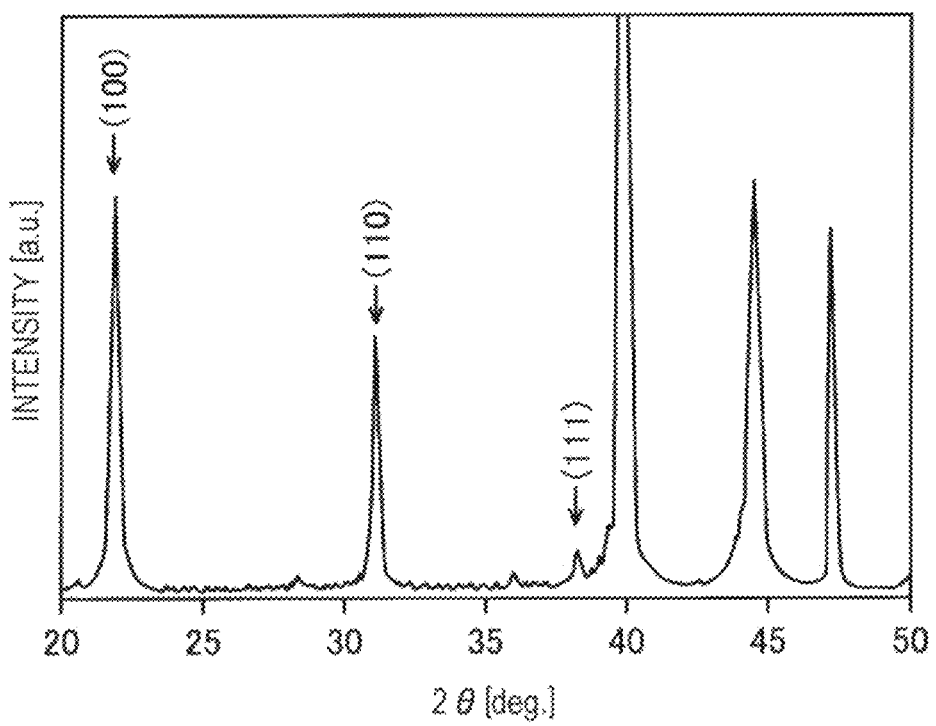
FIG. 10 illustrates an X-ray diffraction pattern of a comparative example.

FIG. 8 illustrates the X-ray diffraction pattern of Example 1. FIG. 9 illustrates the X-ray diffraction pattern of Example 2. FIG. 10 illustrates the X-ray diffraction pattern of the comparative example. In the X-ray diffraction pattern of the comparative example, peak intensity in a (100) plane near 22° and peak intensity in a (110) plane near 31° were high, and peak intensity in a (111) plane near 38° was observed. In contrast, in the X-ray diffraction patterns of Example 1 and Example 2, peak intensity in a (100) plane was high. That is, while the piezoelectric layer was not (100) oriented in the comparative example, the piezoelectric layer was (100) oriented in Example 1 and Example 2.

Figure 11:
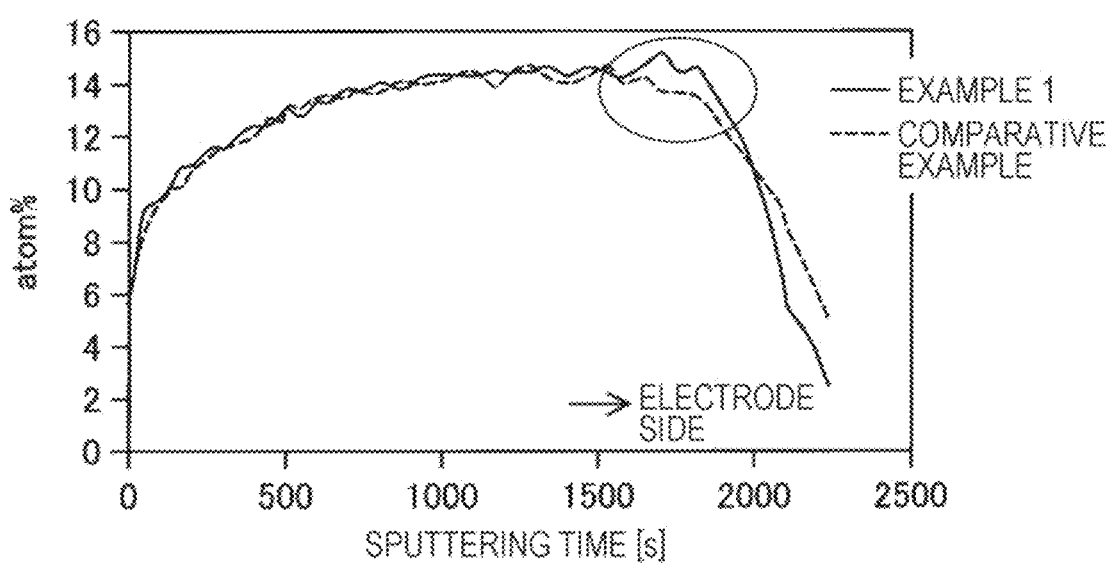
FIG. 11 is a view illustrating a result of XPS.

FIG. 11 illustrates a result of the organization analysis of Ti in a film thickness direction which is performed, by using the XPS, for the sample of Example 1 before formation of the piezoelectric layer and the sample of the comparative example before formation of the piezoelectric layer. At the position indicated by the circle in FIG. 11, while a peak was observed in Example 1, no peak was observed in the comparative example. That is, it is shown that no titanium layer is formed in the comparative example.

From the above-described results, in Example 1 and Example 2 in which the titanium layer was formed under the orientation control layer, the piezoelectric layer was (100) oriented. In contrast, in the comparative example, no titanium layer was formed, and it is shown that the piezoelectric layer is not (100) oriented. It is considered that this is because, since an orientation state of a lower layer, that is, information of a base, is canceled by the titanium layer, it is possible to orient the piezoelectric layer by forming the titanium layer.

D. Other Aspects:

The disclosure is not limited to the above-described embodiments and can be realized in various configurations without departing from the gist thereof. For example, technical features of the embodiments corresponding to the technical features in the respective aspect described in the summary of the disclosure can appropriately be replaced or combined in order to solve some or all of the aforementioned problems or achieve some or all of the aforementioned effects. Moreover, it is possible to appropriately delete the technical features as long as the technical features are not described as essential ones in the present specification.

(1) According to an aspect of the disclosure, a piezoelectric element in which a first electrode, a piezoelectric layer, and a second electrode are stacked in order on a substrate is provided. The piezoelectric element includes an orientation control layer that is provided between the piezoelectric layer and the first electrode and that controls orientation of the piezoelectric layer and a titanium layer that is provided between the first electrode and the orientation control layer and that contains at least Ti. According to the aspect, by including the titanium layer, the piezoelectric element is able to cancel an influence of orientation which is applied from the first electrode and sufficiently orient the orientation control layer. Accordingly, it is possible to suitably orient the piezoelectric layer to be formed on the orientation control layer. It is thus possible to improve piezoelectric characteristics of the piezoelectric element.

(2) In the piezoelectric element of the aforementioned aspect, the titanium layer may have a function of canceling an influence of orientation which is applied from the first electrode to the piezoelectric layer. According to the aspect, it is possible to sufficiently orient the orientation control layer.

(3) In the piezoelectric element of the aforementioned aspect, na<nt may be satisfied, where an amount of substance of a metallic element that is contained in the titanium layer and differs from Ti is na and an amount of substance of Ti contained in the titanium layer is nt.

(4) In the piezoelectric element of the aforementioned aspect, na≤0.4×nt may be satisfied.

(5) In the piezoelectric element of the aforementioned aspect, na≤0.2×nt may be satisfied.

(6) In the piezoelectric element of the aforementioned aspect, the orientation control layer may contain at least one of Pb and Bi.

(7) In the piezoelectric element of the aforementioned aspect, the orientation control layer may contain Pb, Bi, Fe, and Ti.

(8) In the piezoelectric element of the aforementioned aspect, the orientation control layer may contain Pb, Fe, and Ti and may contain no Bi.

(9) In the piezoelectric element of the aforementioned aspect, the orientation control layer may contain Bi, Fe, and Ti and may contain no Pb.

(10) In the piezoelectric element of the aforementioned aspect, a content ratio of Ti of the titanium layer which is measured by EDX analysis may be higher than a content ratio of Ti of the orientation control layer which is measured by EDX analysis.

(11) In the piezoelectric element of the aforementioned aspect, the titanium layer may contain Fe, and a content ratio of Fe of the titanium layer which is measured by EDX analysis may be lower than a content ratio of Fe of the orientation control layer which is measured by EDX analysis.

(12) In the piezoelectric element of the aforementioned aspect, the content ratio of Fe of the titanium layer which is measured by EDX analysis may be higher than a content ratio of Fe of the first electrode which is measured by EDX analysis.

(13) In the piezoelectric element of the aforementioned aspect, when a region in which the piezoelectric layer is interposed between the first electrode and the second electrode is a first region and a region in which the piezoelectric layer is not interposed between the first electrode and the second electrode is a second region, a thickness of the titanium layer in the first region may be larger than a thickness of the titanium layer in the second region.

(14) In the piezoelectric element of the aforementioned aspect, the orientation control layer may be a composite oxide having a perovskite structure.

(15) In the piezoelectric element of the aforementioned aspect, a thickness of the titanium layer may be not less than 1 nm and not more than 30 nm, and a thickness of the orientation control layer may be not less than 5 nm and not more than 200 nm.

(16) According to an aspect of the disclosure, a piezoelectric element in which a first electrode, a piezoelectric layer, and a second electrode are stacked in order on a substrate is provided. The piezoelectric element includes an orientation control layer that is provided between the piezoelectric layer and the first electrode and that controls orientation of the piezoelectric layer and a canceling layer that is provided between the first electrode and the orientation control layer and has a function of canceling an influence of orientation which is applied from the first electrode to the piezoelectric layer. According to the aspect, it is possible to cancel the influence of orientation which is applied from the first electrode and sufficiently orient the orientation control layer.

(17) In the piezoelectric element of the aforementioned aspect, the piezoelectric layer may contain Pb, Zr, and Ti.

(18) In the piezoelectric element of the aforementioned aspect, the piezoelectric layer may contain K, Na, and Nb.

(19) According to an aspect of the disclosure, a liquid ejecting head is provided. The liquid ejecting head may include the piezoelectric element of the aforementioned aspect and a diaphragm that vibrates when the piezoelectric element is driven. According to the aspect, it is possible to provide the liquid ejecting head provided with the piezoelectric element that is oriented and has excellent piezoelectric characteristics.

(20) According to an aspect of the disclosure, a liquid ejecting apparatus is provided. The liquid ejecting apparatus may include the liquid ejecting head and a control section that controls operation of the liquid ejecting head. According to the aspect, it is possible to provide the liquid ejecting apparatus provided with the liquid ejecting head that includes the piezoelectric element having excellent piezoelectric characteristics.

What is claimed is:

1. A piezoelectric element in which a first electrode, a piezoelectric layer, and a second electrode are stacked in order on a substrate, the piezoelectric element comprising:
    an orientation control layer that is provided between the piezoelectric layer and the first electrode and controls orientation of the piezoelectric layer; and
    a titanium layer that is provided between the first electrode and the orientation control layer and contains at least Ti,
    wherein the titanium layer has a function of canceling an orientation influence applied from the first electrode to the piezoelectric layer, and
    wherein the orientation control layer is stacked directly on the titanium layer.

2. The piezoelectric element according to claim 1, wherein
    na<nt, wherein an amount of substance of a metallic element that is contained in the titanium layer and differs from Ti is na and an amount of substance of Ti contained in the titanium layer is nt.

3. The piezoelectric element according to claim 2, wherein
    na≤0.4×nt.

4. The piezoelectric element according to claim 2, wherein
    na≤0.2×nt.

5. The piezoelectric element according to claim 1, wherein
    the orientation control layer contains at least one of Pb and Bi.

6. The piezoelectric element according to claim 5, wherein
    the orientation control layer contains Pb, Bi, Fe, and Ti.

7. The piezoelectric element according to claim 5, wherein
    the orientation control layer contains Pb, Fe, and Ti and does not contain Bi.

8. The piezoelectric element according to claim 5, wherein
    the orientation control layer contains Bi, Fe, and Ti and does not contain Pb.

9. The piezoelectric element according to claim 6, wherein
    a content ratio of Ti of the titanium layer which is measured by energy dispersive X-ray spectroscopy analysis is higher than a content ratio of Ti of the orientation control layer which is measured by energy dispersive X-ray spectroscopy analysis.

10. The piezoelectric element according to claim 6, wherein
the titanium layer contains Fe, and
a content ratio of Fe of the titanium layer which is measured by energy dispersive X-ray spectroscopy analysis is lower than a content ratio of Fe of the orientation control layer which is measured by energy dispersive X-ray spectroscopy analysis.

11. The piezoelectric element according to claim 10, wherein
the content ratio of Fe of the titanium layer which is measured by energy dispersive X-ray spectroscopy analysis is higher than a content ratio of Fe of the first electrode which is measured by energy dispersive X-ray spectroscopy analysis.

12. The piezoelectric element according to claim 1, wherein
when a region in which the piezoelectric layer is interposed between the first electrode and the second electrode is a first region and a region in which the piezoelectric layer is not interposed between the first electrode and the second electrode is a second region,
a thickness of the titanium layer in the first region is larger than a thickness of the titanium layer in the second region.

13. The piezoelectric element according to claim 1, wherein
the orientation control layer is a composite oxide having a perovskite structure.

14. The piezoelectric element according to claim 1, wherein
a thickness of the titanium layer is not less than 1 nm and not more than 30 nm, and
a thickness of the orientation control layer is not less than 5 nm and not more than 200 nm.

15. The piezoelectric element according to claim 1, wherein
the piezoelectric layer contains Pb, Zr, and Ti.

16. The piezoelectric element according to claim 1, wherein
the piezoelectric layer contains K, Na, and Nb.

17. A liquid ejecting head comprising:
the piezoelectric element according to claim 1; and
a diaphragm that vibrates when the piezoelectric element is driven.

18. A liquid ejecting apparatus comprising:
the liquid ejecting head according to claim 17; and
a control section that controls operation of the liquid ejecting head.

19. The piezoelectric element according to claim 1, wherein no piezoelectric layer exists between the first electrode and the orientation control layer.

20. The piezoelectric element according to claim 1, wherein the titanium layer is stacked directly on the first electrode.

* * * * *